United States Patent
Lee et al.

(10) Patent No.: US 9,429,627 B2
(45) Date of Patent: Aug. 30, 2016

(54) ELECTRONIC DEVICE WITH SUPERVISOR CIRCUIT FOR DETECTING RESISTANCE PARAMETER OF AN ENERGY STORAGE DEVICE

(71) Applicant: THE REGENTS OF THE UNIVERSITY OF MICHIGAN, Ann Arbor, MI (US)

(72) Inventors: In Hee Lee, Ann Arbor, MI (US); Yoonmyung Lee, Ann Arbor, MI (US); Dennis Michael Sylvester, Ann Arbor, MI (US); David Theodore Blaauw, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 162 days.

(21) Appl. No.: 14/296,764

(22) Filed: Jun. 5, 2014

(65) Prior Publication Data
US 2015/0355281 A1    Dec. 10, 2015

(51) Int. Cl.
*H02J 7/00* (2006.01)
*G01R 31/36* (2006.01)

(52) U.S. Cl.
CPC ......... *G01R 31/3606* (2013.01); *H02J 7/0063* (2013.01); *H02J 2007/0067* (2013.01)

(58) Field of Classification Search
CPC .......... G01R 31/3606; G01R 31/3658; G01R 31/3662; H02J 7/0063; H02J 7/0075; H02J 7/0077
USPC ................ 320/103, 127–129, 134–138, 166; 324/430, 600
See application file for complete search history.

(56) References Cited

U.S. PATENT DOCUMENTS

| | | | | |
|---|---|---|---|---|
| 5,862,515 | A * | 1/1999 | Kobayashi ......... | G01R 31/3662 324/428 |
| 2004/0054503 | A1* | 3/2004 | Namaky .............. | G01R 31/007 702/183 |
| 2005/0194933 | A1* | 9/2005 | Arnold ................. | H02J 7/0077 320/128 |
| 2008/0122399 | A1* | 5/2008 | Nishino ............... | H02J 7/0075 320/103 |
| 2009/0212740 | A1* | 8/2009 | Felps ................. | G01R 31/3606 320/134 |
| 2009/0224771 | A1* | 9/2009 | Deveau ............. | G01R 31/3658 324/600 |
| 2010/0224157 | A1* | 9/2010 | Mizuno ............. | G01R 31/3662 123/179.4 |
| 2012/0119745 | A1* | 5/2012 | Deveau ............. | G01R 31/3631 324/429 |

OTHER PUBLICATIONS

Le et al. "A Long Reset-Time Power-On Reset Circuit With Brown-Out Detection Capability," *IEEE Trans. Circuits Syst. II, Exp. Briefs*, vol. 58, No. 11, pp. 778-782, Nov. 2011.

(Continued)

*Primary Examiner* — Paul Dinh
(74) *Attorney, Agent, or Firm* — Pramudji Law Group PLLC; Ari Pramudji (57) ABSTRACT

An electronic device has an energy storage device and circuitry supplied with a storage device voltage from the energy storage device. A supervisor circuit enables the circuitry in response to the storage device exceeding an enable threshold voltage. The supervisor circuit detects a resistance parameter which is indicative of an internal resistance of the energy storage device and adjusts the enable threshold voltage based on the resistance parameter.

20 Claims, 6 Drawing Sheets

(56) References Cited

OTHER PUBLICATIONS

Lee et al. "A 635pW battery voltage supervisory circuit for miniature sensor nodes," in *IEEE Symp. VLSI Circuits Dig.*, 2012, pp. 202-203.
TPS3839 Datasheet, Texas Instruments, Jun. 2012, 26 pgs.
CBC005 Datasheet, CYMBET, 2012, 3 pgs.
Bergveld et al., Battery Management Systems. 2002, 328 pgs.
Lee, et al., "A Modular 1 mm3 Die-Stacked Sensing Platform With Low Power I2C Inter-Die Communication and Multi-Modal Energy Harvesting," *IEEE J. Solid-State Circuits*, vol. 48, No. 1, pp. 229-243, Jan. 2013.
Chow et al. "A Miniature-Implantable RF-Wireless Active Glaucoma Intraocular Pressure Monitor," *IEEE Trans. Biomed. Circuits Syst*, vol. 4, No. 6, pp. 340-349, Dec. 2010.

\* cited by examiner

ELECTRONIC DEVICE WITH SUPERVISOR CIRCUIT FOR DETECTING RESISTANCE PARAMETER OF AN ENERGY STORAGE DEVICE

BACKGROUND

Technical Field

The present technique relates to the field of electronic devices. More particularly, the technique relates to electronic devices having an energy storage device in which circuitry is enabled when a storage device voltage from the energy storage device exceeds an enable threshold voltage.

An electronic device may have an energy storage device, such as a battery or a capacitor. A storage device voltage supplied from the energy storage device may vary over time, for example depending on temperature or on the energy consumption of the circuitry supplied with the voltage. The circuitry may require a minimum voltage to operate, and so the circuitry may be enabled only if the storage device voltage exceeds an enable threshold voltage.

SUMMARY

Viewed from one aspect, the present technique provides an electronic device comprising:
an energy storage device;
circuitry supplied with a storage device voltage from the energy storage device; and
a supervisor circuit configured to enable the circuitry in response to the storage device voltage exceeding an enable threshold voltage;
wherein the supervisor circuit is configured to detect a resistance parameter indicative of an internal resistance of the energy storage device and to adjust the enable threshold voltage based on the resistance parameter.

In known systems, the enable threshold voltage is typically a fixed threshold set to accommodate worst case conditions. When the storage device voltage exceeds the threshold and the circuitry is enabled, a current is drawn from the energy storage device which causes an immediate drop in the storage device voltage. The voltage drop is proportional to the internal resistance of the energy storage device. The internal resistance can vary, because for example the resistance may be temperature dependent and may increase over time as the energy storage device is charged and discharged. Therefore, typically the enable threshold voltage is set with a margin to account for the voltage drop which will occur on enabling the circuitry in the worst case scenario expected over the lifetime of the storage device. This extra margin reduces the usable range of voltages at which the circuitry can operate and delays the circuitry being enabled so that less efficient use is made of the energy available.

To address these issues, the present technique provides a supervisor circuit which detects a resistance parameter indicative of an internal resistance of the energy storage device and which adjusts the enable threshold voltage based on the resistance parameter. This allows the enable threshold voltage to be adapted to the changing internal resistance of the energy storage device, avoiding the need for any additional margin in the enable threshold voltage. This allows the circuitry to be enabled earlier without a delay caused by the margin. Also, by accounting for the resistance of the energy storage device, the risk of the circuitry oscillating between enabled and disabled states can be reduced.

The energy storage device may be a battery or may be a capacitor or supercapacitor. The internal resistance of a capacitor tends to remain relatively constant with time (unlike a battery where the resistance tends to increase with increasing numbers of charge/discharge cycles). Even if the resistance does not vary significantly over time, the present technique may still be useful since the circuitry and supervisor circuit may be designed for use with a range of different types of energy storage devices which may have different resistances, and the present technique allows the supervisor circuit to automatically adapt to the particular resistance of the energy storage device that has been selected. This avoids the need to margin the enable threshold voltage based on the energy storage device with the worst case resistance.

However, the present technique is particularly useful if the energy storage device is a battery. Battery health declines with discharge cycles and so the internal resistance of the battery may increase over time. By adapting the enable threshold voltage to the internal resistance of the battery, it is not necessary to margin he threshold based on the worst case resistance expected, which would cause a significant delay in enabling the circuitry when the battery is near the start of its lifetime. This technique is particularly advantageous for small electronic devices such as wireless sensor nodes which employ small batteries having a high internal resistance, e.g. of the order of 7 kΩ.

The energy storage device may be provided with an energy harvesting unit for harvesting ambient energy which is used to charge the energy storage device. Depending on the amount of ambient energy available, the voltage provided from the storage device may vary, and so devices with energy harvesting units may often apply an enable voltage threshold for determining whether to enable the circuitry. Hence, the present technique is particularly useful for devices having an energy harvesting unit, such as wireless sensor nodes. The energy harvesting unit may for example comprise a photovoltaic cell for harvesting energy from solar radiation, a thermoelectric device for harvesting energy from temperature gradients, a vibration harvester for harvesting energy from acoustic or mechanical vibrations, or an electromagnetic energy harvester for harvesting energy from electromagnetic radiation such as radio waves.

The supervisor circuit may disable the circuitry in response to the storage device voltage dropping below a disable threshold voltage. The disable threshold voltage may be less than the enable threshold voltage. This provides some hysteresis to avoid oscillation where the circuitry is repeatedly enabled and disabled in quick succession. With previous systems using a fixed threshold, a large margin between the enable and disable thresholds is required to ensure that when the circuitry is enabled, the IR voltage drop does not cause the storage device voltage to drop below the disable threshold voltage even when the energy storage device has a very high resistance. By adapting the enable threshold voltage to the detected resistance parameter, it is not necessary to provide such a margin, so that the enabling of the circuitry is not delayed unnecessary and so the total amount of time when the voltage is high enough to use the circuitry can be increased.

The supervising circuit may adjust the enable threshold voltage in various ways. For example, the enable threshold voltage can be set to a value which corresponds to a sum of a target threshold voltage and a margin voltage, with the margin voltage depending on the resistance parameter. Hence, the target threshold voltage may be the effective threshold voltage at which it is desired to turn on the circuitry (in the ideal case assuming there is no IR drop), and the margin voltage represents the expected IR drop which would occur when the circuitry is enabled, so that even when the internal resistance increases, after enabling the circuitry the storage device voltage will settle at the effective threshold voltage. For example, the margin voltage may correspond to $I_{SYSTEM} \times R_{STORAGE}$, where $I_{SYSTEM}$ is the maximum current drawn by the circuitry when enabled and $R_{STORAGE}$ is the internal resistance of the storage device. In small wireless systems, the current $I_{SYSTEM}$ when enabling the circuitry is typically well-defined since wireless sensor nodes tend to have a well-defined operation which does not vary significantly. Therefore, it is feasible to update the threshold voltage to the target threshold voltage plus $I_{SYSTEM} \times R_{STORAGE}$ based on the measured resistance parameter representing $R_{STORAGE}$.

Although the enable threshold voltage may correspond to the sum of the target threshold voltage and a margin voltage, it is not necessary to actually perform this addition. Instead, the supervising circuit may have a range of threshold voltage levels available and may select one of these threshold voltages which is expected to correspond to the sum of the target threshold voltage of the margin voltage. For example the supervisor circuit may have a threshold voltage generator which generates multiple different threshold levels (for example, using a voltage divider). The resistance parameter may then be used to select one of the voltages generated by the threshold voltage generator, for use as the enable threshold voltage. The threshold voltage generator may be configured so that the relationship between the resistance parameter and the selected enable threshold voltage level tracks the expected sum of the target threshold voltage and the margin voltage when the margin voltage is proportional to the resistance.

The supervisor circuit may trigger the detection of the resistance parameter and adjustment of the enable threshold voltage at any time, for example periodically or in response to certain events. In one example, the detection of the resistance parameter and the adjustment of the enable threshold voltage may occur in response to the storage device voltage exceeding a current value of the enable threshold voltage. Hence, when the storage device voltage exceeds the current threshold and so the circuitry would normally be enabled at this point, the supervisor circuit detects the resistance parameter and adjusts the enable threshold voltage to reflect the measured resistance of the energy storage device. This avoids the need to repeatedly adjust the enable threshold when the voltage still remains below the previous threshold anyway, and also enables the circuitry for triggering the enable signal to be reused for also triggering the resistance monitoring. This approach may be useful for storage devices where the internal resistance is generally expected to increase with time (e.g. a battery for which the resistance increases with discharge cycles). However, if there is a likelihood that the resistance could sometimes decrease, then it may be useful to also perform further recalibrations of the enable threshold, for example triggered periodically, to ensure that the circuitry is not left permanently in the disabled state.

The supervisor circuit may implement a delay between the storage device voltage exceeding the enable threshold and enabling the circuitry. This can be useful for several reasons. Firstly, the circuitry may need to be reset before it is enabled and so the delay period provides time for this. Also, providing a delay helps guard against oscillations which can occur when the storage device voltage only temporarily rises above the enable threshold and then falls below it again. Hence, if the storage device voltage no longer exceeds the threshold by the end of the delay period, then enabling of the circuitry can be inhibited. This mechanism is also useful when the threshold voltage is being adjusted, since the adjustment to the threshold triggered by the storage device voltage rising above the previous threshold may cause the threshold to be set higher, so that by the end of the delay period the storage device voltage no longer exceeds the threshold. Hence, the delay provides time for the resistance monitoring to complete to avoid enabling the circuitry if the IR drop would cause the voltage to drop too low.

There may be various ways of measuring the resistance of the energy storage device. The supervisor circuit may have a test current generator which draws a test current from the energy storage device for testing the internal resistance of the energy storage device. When a test current is drawn, the response of the system to the test current may give an indication of the internal resistance.

Drawing a test current from the energy storage device may cause a voltage drop and if the circuitry is still connected to the storage device voltage then this could cause errors. Therefore, an isolation switch may be provided to isolate the circuitry from the storage device voltage when the test current is drawn from the energy storage device.

In one example, the monitored resistance parameter may indicate an amount by which the storage device drops when the test current is applied. The voltage drop may depend on the product of the amount of test current drawn and the internal resistance of the storage device, and so if the amount of test current is known then the internal resistance can be deduced.

Alternatively, the test current generator may include at least one capacitive element coupled across the energy storage device. When the test current is drawn, there may be a voltage drop, and then the storage device voltage may rise again with a rate that depends on both the capacitance of the at least one capacitive element and the internal resistance of the storage device. Hence, by measuring a parameter which depends on the rate at which the voltage rises, the internal resistance can be monitored.

For example, the resistance parameter may comprise a count value which represents a time taken for the storage device voltage to rise to a sample voltage level following the voltage drop caused by the test current. For example, the sample voltage level may be set to a fraction of a level that the storage device voltage had prior to drawing the test current. By setting the sample voltage level relative to the storage voltage level, variation in the storage voltage level does not affect the measured count value, which will depend on the RC time constant of the capacitive element and storage device, not on other factors affecting the voltage level such as temperature or circuit load. A counter may increment the count value in response to a count clock signal until the storage device voltage exceeds the sample of voltage level (the counter may be start counting either at the point when the voltage drops in response to the test current, or at a later point when the voltage rises above a count start threshold). A clock generator for generating the count clock signal may be powered by a regulated voltage provided by a voltage regulator, which is useful to prevent the clock frequency of the clock generator varying with system current consumption.

The test current may be generated in different ways. However, in one example the test current generator may have a number of capacitors and switches which can select whether the capacitors are coupled in parallel across the energy storage device or are coupled in series across the energy storage device. The test current generator may generate the test current by switching the switches from a first state in which the capacitors are coupled in series to a second state in which the capacitors are coupled in parallel. When in series, the capacitors are discharged and charge on the capacitors flows back to the energy storage device. When the capacitors are then switched to a parallel state, the storage device charges the capacitors and a relatively large current is drawn from the storage device. This test current can then be used to monitor the internal resistance. In the case where the resistance parameter represents the RC time constant, the capacitors used for generating the test current may also serve as the capacitive elements which provide the "C" part of the RC time constant.

Hence, prior to generating the test current, the test current generator may switch the switches from the second state in which the capacitors are coupled in parallel (e.g. the state remaining from a previous instance when the resistance of the storage device was monitored) to the first state in which the capacitors are coupled in series. If this is done suddenly in one step, there can be a large overshoot in the storage device voltage which could potentially damage the circuitry. To reduce the likelihood of damage, the capacitors can be switched from the second state to the first state in multiple steps with each step coupling only a subset of the capacitors together in series. By staggering the switching of the capacitors into the series state, damage to the circuitry can be reduced.

References to resistance in the present application should be interpreted as including monitoring of impedance. In general, the monitoring of resistance discussed in the embodiments below can be considered as detecting the impedance of the energy storage device at a relatively low frequency. In other systems it is possible to monitor the impedance at different frequencies and phases and set the voltage threshold based on the detected impedance.

Viewed from another aspect, the present technique provides an electronic device comprising:

energy storage means for storing energy;

circuit means for being supplied with a storage device voltage from the energy storage means; and supervising means for enabling the circuit means in response to the storage device voltage exceeding an enable threshold voltage;

wherein the supervising means is configured to detect a resistance parameter indicative of an internal resistance of the energy storage means and to adjust the enable threshold voltage based on the resistance parameter.

Viewed from a further aspect, the present technique provides a method for an electronic device comprising an energy storage device and circuitry supplied with a storage device voltage from the energy storage device; the method comprising:

detecting whether the storage device voltage exceeds an enable threshold voltage;

enabling the circuitry in response to the storage device voltage exceeding the enable threshold voltage;

detecting a resistance parameter indicative of an internal resistance of the energy storage device; and adjusting the enable threshold voltage based on the resistance parameter.

Further aspects, features and advantages of the present technique will be apparent from the following description of example embodiments which are to be read with reference to the accompanying drawings.

DESCRIPTION OF EXAMPLES

Figures 1, 2:
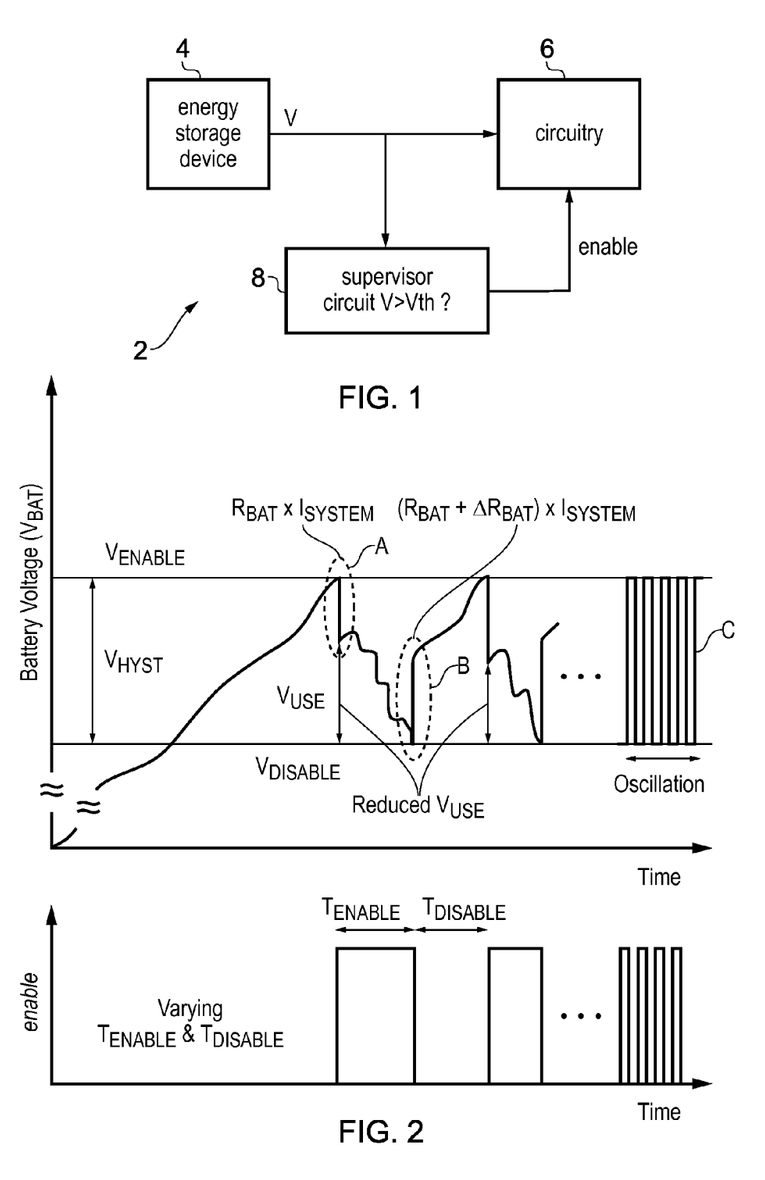
FIG. 1 schematically illustrates an example of an electronic device.
FIG. 2 shows a problem which may occur when enabling circuitry in the device based on whether a storage device voltage exceeds a fixed enable threshold voltage.

FIG. 1 schematically illustrates an example of an electronic device 2 having an energy storage device 4 for storing energy, such as a battery or a capacitor. In the subsequent examples, for ease of explanation the energy storage device 4 is assumed to be a battery, but it will be appreciated that other forms of energy storage device could also be provided, such as a supercapacitor. The energy storage device 4 may be charged from a wired power supply or from an energy harvesting unit as discussed below. The device 2 also has circuitry 6 which receives a storage device voltage provided by the energy storage device 4, and a supervisor circuit 8 for monitoring the storage voltage and selecting whether to enable the circuitry 6 depending on whether the storage voltage is greater than an enable voltage threshold. The circuitry 6 may be any circuitry having a given functionality within the electronic device 2, such as a processor, microcontroller, memory unit, radio transmitter or receiver, etc. If the circuitry 6 is enabled, it can perform its functionality, e.g. processing data, providing access to data stored in the memory, transmitting a radio signal, etc, while when disabled this functionality cannot be provided. If the circuitry 6 is a memory, data may be retained when the memory is disabled, but access to the data from other circuits may not be possible when disabled. In the disabled state, the circuitry 6 consumes less energy than in the enabled state. For example, power gating may be used to implement the disabling/enabling of the circuitry 6, with power gates controlling whether a voltage is supplied to the circuitry 6 or not.

FIG. 2 shows an example of a problem which may occur with systems of this type. The battery voltage $V_{BAT}$ varies with time and two threshold voltages $V_{ENABLE}$ and $V_{DISABLE}$ are set to control enabling of the circuitry 6 and disabling of the circuitry 6 respectively. The enable voltage threshold $V_{ENABLE}$ is set higher than the disable voltage threshold $V_{DISABLE}$ with a certain margin $V_{HYST}$ or hysteresis between them. This is because when the voltage rises to $V_{ENABLE}$ and the circuitry 6 is enabled, a current $I_{SYSTEM}$ is drawn from the battery 4 by the circuitry 6 so that the battery voltage $V_{BAT}$ immediately drops by an amount $R_{BAT} \times I_{SYSTEM}$, where $R_{BAT}$ is the internal resistance of the battery (see part A of FIG. 2). Conversely, when the voltage drops below $V_{DISABLE}$, the reduced system current means that there is an upward spike in the battery voltage as shown in part B of FIG. 2. If the voltage drop on enabling the circuitry or the voltage rise on disabling the circuitry is larger than the hysteresis margin $V_{HYST}$, the system will oscillate repeatedly between the enable state and the disable state as shown in the right hand part C of FIG. 2, which would prevent the circuitry 6 from functioning properly.

Miniature wireless sensor nodes are unique in that they employ very small batteries, such as thin film batteries, which have a high internal resistance $R_{BAT}$ (e.g. in the order of 7 kΩ) so there is a risk of large IR drops and spikes. Also, battery health declines with increasing numbers of discharge cycles, so that $R_{BAT}$ may increase for example from 7 kΩ to 31 kΩ over a 1000 discharge cycles. Battery internal resistance is also temperature dependent. Therefore, it is usual to provide a large hysteresis margin $V_{HYST}$ to accommodate the worst case battery internal resistance expected over its lifetime. However, for most of its lifetime the battery may have a lower resistance than this worst case resistance, and so most of the time the margin is unnecessary high, which delays enabling the circuitry, so that the circuitry 6 is idle even when the voltage would have been high enough to support the circuitry. Also, over time the resistance of the battery increases, and so with a fixed enable threshold the range of voltages $V_{USE}$ at which the circuitry 6 can be enabled reduces, as shown in FIG. 2, so there is less chance that the voltage will lie in the usable range. Both these factors reduce the amount of "usable time" when the circuitry 6 is enabled.

Figure 3:
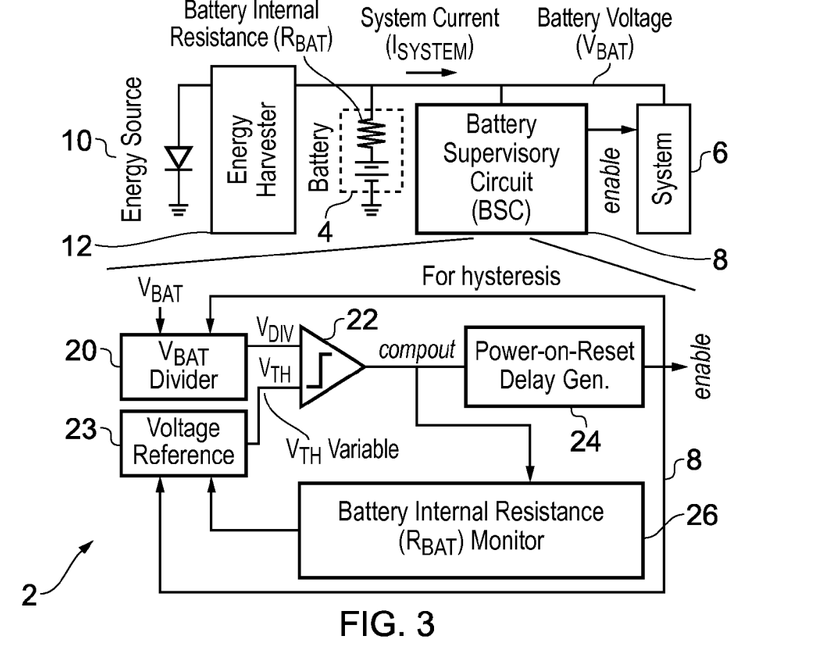
FIG. 3 shows an electronic device having a supervisor circuit for monitoring the internal resistance of the storage device.

FIG. 3 shows an example of the electronic device which is provided with a battery supervisor circuit 8 for addressing this problem. In addition to the battery 4, circuitry 6 and battery supervisor circuit 8, the device 2 also has an energy harvesting unit for harvesting energy from ambient energy comprising an energy source 10 and an energy harvester 12. The energy source 10 may for example comprise a solar (photovoltaic) cell, thermoelectric device or piezoelectric device, or radio frequency energy harvester. Some devices may be provided with more than one type of energy source 10. The ambient energy may be directed energy that is provided deliberately to the device or may be energy that just happens to be in the vicinity of the device. The energy harvester 12 may for example be a voltage regulator which provides a regulated voltage for charging the battery 4. If the energy source 10 generates AC voltage then the energy harvester 12 may include a rectifier for generating a DC voltage.

The supervisor circuit 8 is shown in more detail at the bottom of FIG. 3. The supervisor circuit 8 has a voltage divider 20 which receives the battery voltage V.sub.BAT and divides it to generate a lower voltage V.sub.DIV which corresponds to a given fraction of the battery voltage V.sub.BAT. A comparator 22 compares the divided voltage V.sub.DIV against a threshold voltage V.sub.TH generated by a voltage reference generator 23 which can generate variable threshold voltages. If the circuitry 6 is currently enabled, then the threshold voltage V.sub.TH corresponds to the disable threshold voltage V.sub.DISABLE, while if the circuitry 6 is currently disabled then the threshold voltage V.sub.TH represents the enable threshold voltage V.sub.ENABLE (in other examples, separate comparators 22 and reference voltage generators 23 may be provided for the enable/disable thresholds). The comparator 22 generates a comparator output signal (compout) depending on whether V.sub.DIV is greater or less than the threshold V.sub.TH. A power-on-reset delay generator 24 delays the comparator output signal and generates an enable signal for enabling the circuitry 6 if the comparator output stays high for at least a given delay period. If the comparator output returns low during the delay period, for example if the battery voltage is no longer higher than the threshold, then the enable signal is disabled to inhibit waking up the circuitry 6. The supervisor circuit 8 has a battery internal resistance monitoring circuit (resistance monitor) 26 which detects a resistance parameter which is indicative of the internal resistance R.sub.BAT of the battery 4. The resistance monitor 26 controls the voltage reference generator 23 to vary the enable threshold voltage depending on the resistance parameter.

Figure 4:
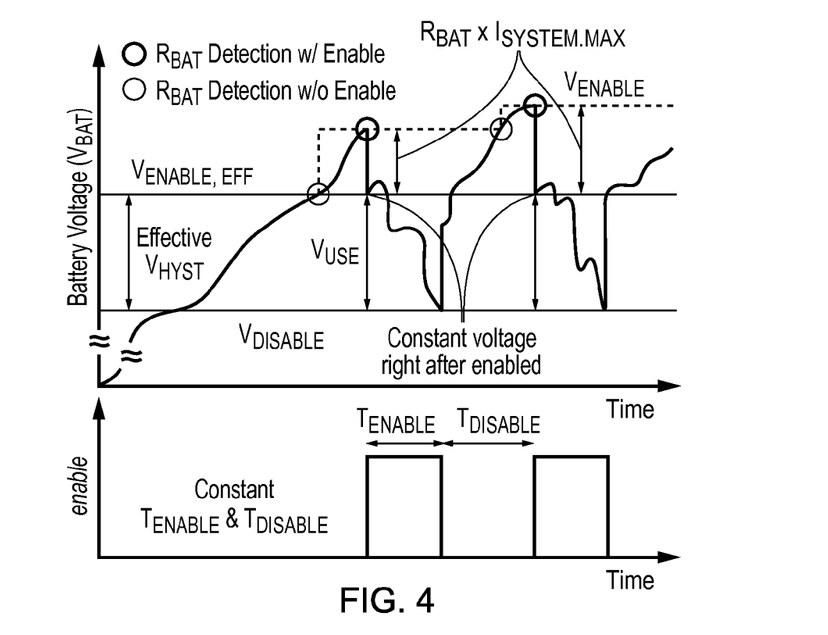
FIG. 4 shows an example of the operation of the system in FIG. 3.

As shown in FIG. 4, the supervisor circuit 8 adapts the enable threshold voltage $V_{ENABLE}$ based on the varying internal resistance $R_{BAT}$ to obtain an effective enable threshold voltage $V_{ENABLE.EFF}$ which is constant and independent of the internal resistance of the battery 4. When the battery voltage $V_{BAT}$ reaches $V_{ENABLE}$, the resistance monitor 26 measures the battery resistance by inducing a test current and measuring the response of the battery voltage $V_{BAT}$ to the test current. For example, the resistance monitor 26 may measure an amount of voltage drop caused by the test current, or an RC response as discussed in the examples below, to obtain an indication of the battery resistance $R_{BAT}$. The enable threshold voltage $V_{ENABLE}$ is updated to a new value $V_{ENABLE} = V_{ENABLE.EFF} + R_{BAT} \times I_{SYSTEM.MAX}$, where $I_{SYSTEM.MAX}$ is the maximum current drawn by the circuitry 6 when enabled. The voltage reference generator 24 has a number of available reference voltages and one of these can be selected depending on the monitor resistance parameter, to give an enable threshold voltage which at least approximately tracks $V_{ENABLE.EFF} + R_{BAT} \times I_{SYSTEM.MAX}$. Hence, $V_{ENABLE.EFF}$ represents a target enable threshold which is the ideal threshold at which the circuitry 6 would be enabled if there was no IR voltage drop, and $R_{BAT} \times I_{SYSTEM.MAX}$ represents a margin provided to ensure that when the IR voltage drop occurs following enabling at the new threshold $V_{ENABLE}$, the voltage will now be at the desired target voltage $V_{ENABLE.EFF}$. The battery voltage $V_{BAT}$ is now compared against the new enable threshold voltage and the circuitry 6 is enabled if the battery voltage is larger than the new threshold. Otherwise, the system waits for the battery voltage to increase until it is larger than the new threshold, at which point the process repeats. While this technique requires knowledge of the maximum current $I_{SYSTEM.MAX}$ drawn by the circuitry 6 when enabled, this is feasible in many small wireless systems because these systems typically have a well defined operation for which a relatively constant current is drawn. In this approach, the effective hysteresis value is $V_{ENABLE.EFF} - V_{DISABLE}$, and is independent of the internal resistance $R_{BAT}$ of the battery 4. However, as the actual enable threshold voltage $V_{ENABLE}$ is varied based on the monitored internal resistance, there is no need to provide an additional margin to accommodate worst case conditions, to avoid the problems described with respect to FIG. 2.

Figure 5:
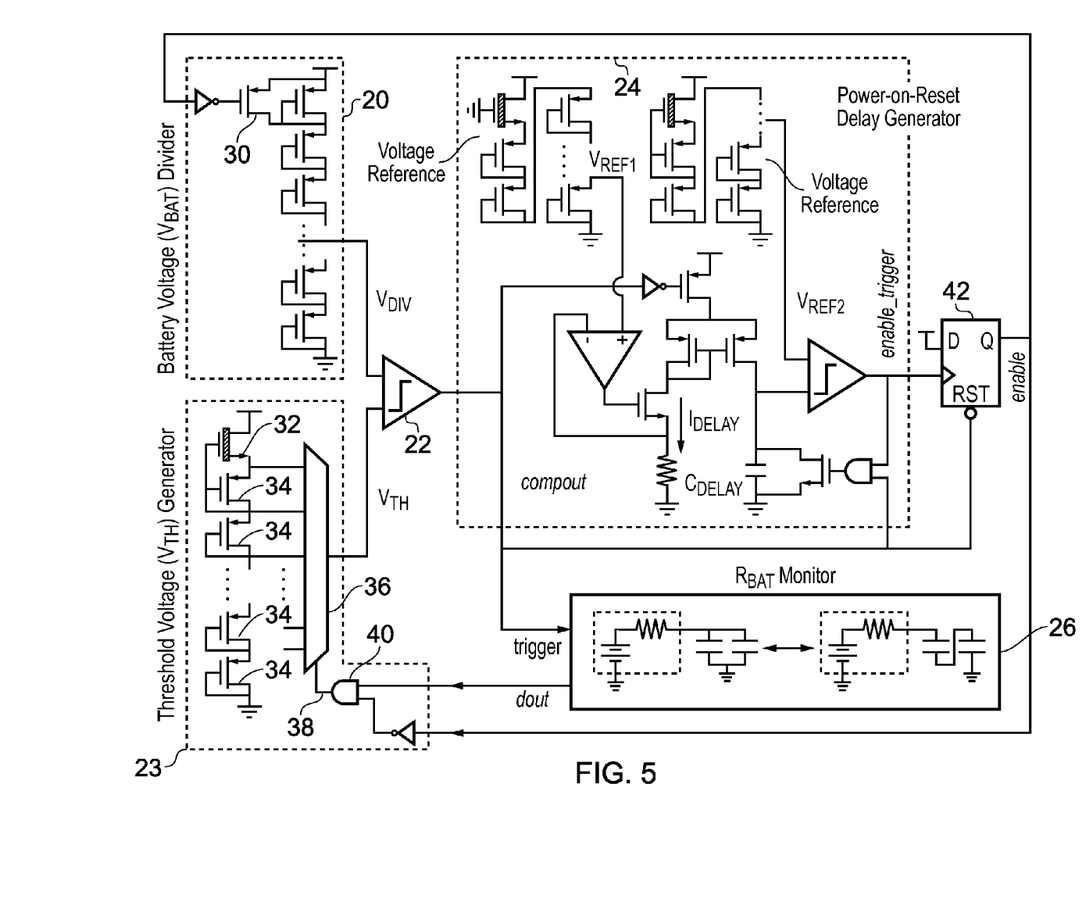
FIG. 5 shows a more detailed example of the supervisor circuit.

FIG. 5 shows an example circuit which can be used for the supervisor circuit 8. The voltage divider 20 comprises a number of diode connected PMOS transistors with the divided voltage being taken from a given point within the chain of transistors. Each transistor experiences a given voltage drop across it and so depending on the point from which the divided voltage is taken, a given ratio between the battery voltage $V_{BAT}$ applied to the start of the chain and the divided voltage $V_{DIV}$ can be provided. One of the transistors can be selectively included or eliminated from the chain of transistors based on the enable signal which is applied to a selecting transistor 30. Depending on whether the enable signal is 0 (circuitry disabled) or 1 (circuitry enabled), the diode connected transistor chain is selected to have different lengths so that, for example, the division ratio may be 3.25 when enable is 0 and 3.05 when enable is 1. This is useful for allowing the same comparator 22 to provide both the comparison against the enable voltage threshold and the comparison against the disabled threshold. By dividing the voltage in different ratios, this effectively means that the threshold voltage $V_{TH}$ has different levels relative to the divided voltage $V_{DIV}$, even if the threshold voltage $V_{TH}$ keeps the same value. In other examples, the voltage divider 20 could have a fixed division ratio and the different disable/enable thresholds may be provided by changing the threshold voltage $V_{TH}$.

The threshold voltage generator 23 similarly includes a chain of diode connected transistors. The voltage threshold generator 23 includes a leakage based voltage reference/divider and provides 64 possible analogue reference voltages from 1.06 volts to 1.28 volts for the adaptive voltage threshold. This design of reference generator 23 has been simulated as consuming 77 pA while providing 319 ppm/° C. TC and 0.17%/V line sensitivity (measured). The reference generator 23 has a zero-$V_{TH}$ NMOS transistor 32 at the top of the stack for leakage generation and diode connected PMOS transistors 34 which provide multiple outputs to a multiplexer 36 which selects a particular threshold voltage level depending on an input control signal 38. The control signal is dependent on the enable signal generated by the supervisor circuit and on the output of the resistance monitor.

When the divided voltage $V_{DIV}$ is greater than the threshold voltage $V_{TH}$, the comparator separates a high comparator output signal which triggers the resistance monitor 26 to start detecting the internal resistance of the battery. The resistance monitor 26 includes capacitors which can be coupled in series or parallel to induce a test current which can be used to probe the internal resistance. This is described more below with reference to FIG. 6. The resistance monitor 26 produces an output signal dout which controls the multiplexer 36 to select a particular threshold voltage level. The threshold voltage generator 23 is configured so that the mapping between the resistance parameter dout and the selected threshold $V_{TH}$ tracks $V_{ENABLE}=V_{ENABLE.EFF}+R_{BAT} \times I_{SYSTEM.MAX}$ as discussed above. If the changed threshold voltage causes $V_{DIV}$ to be below the threshold $V_{TH}$ then the enable trigger signal will remain low since the time required for the resistance detection by the resistance monitor 26 may be much faster than the power-on reset delay provided by the delay generator 24 (for example 17.8 ms for the resistance monitor 26 compared to a delay of over 50 ms provided by the power-on reset delay generator 24). The enable signal also gates the threshold voltage generator, so that when the enable signal is high (circuitry 6 currently enabled), AND gate 40 is clamped low to select a fixed threshold voltage $V_{TH}$ which in combination with the division ratio applied by voltage divider 20 implements the disable threshold voltage $V_{DISABLE}$.

The delay generator 24 uses a voltage reference $V_{REF1}$ to drive a current source which generates a current $I_{DELAY}$ (3.3 nA in this example). The current is mirrored to a capacitor $C_{DELAY}$. When the comparator output 22 switches high, the current $I_{DELAY}$ starts charging the capacitor $C_{DELAY}$ and eventually the voltage at the capacitor will rise above a second reference voltage $V_{REF2}$ which is compared against the voltage at the capacitor using a comparator. When the voltage on the capacitor $C_{DELAY}$ exceeds $V_{REF2}$, an enable trigger signal (enable_trigger) switches states and this flips the state of flip flop 42 to assert the enable signal to cause the circuitry 6 to be enabled. The first reference voltage $V_{REF1}$ compensates the temperature dependence of the resistor charged by $I_{DELAY}$ to provide a temperature insensitive delay (0.9%/° C. TC, 9.7%/V line sensitivity, measured). The flip flop 42 is reset if the comparator output drops low before the end of the delay period, to inhibit enabling of the circuitry 6. It will be appreciated that other forms of delay generator 24 could also be provided.

Figure 6:
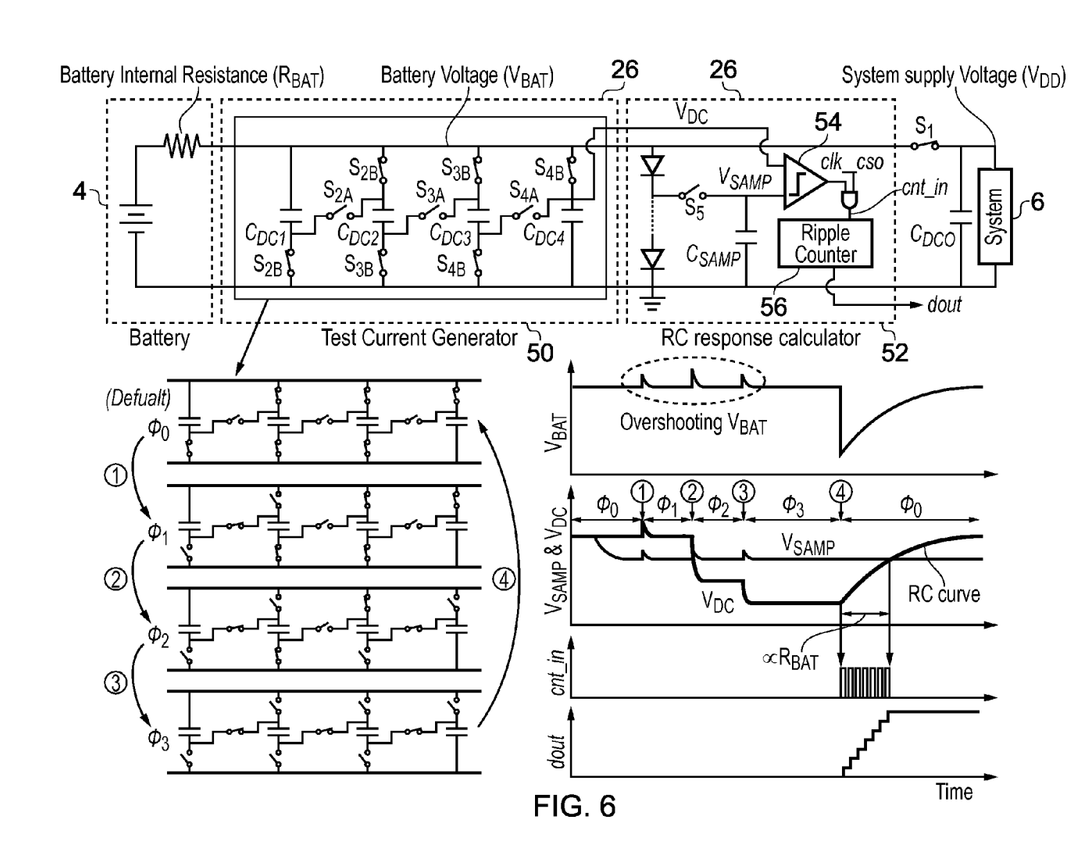
FIG. 6 shows an example of a resistance monitoring circuit.

FIG. 6 shows a circuit example of the resistance monitor 26. The resistance monitor 26 has a test current generator 50 for generating a test current to be drawn from the battery 4, and an RC response calculator 52 which calculates the resistance parameter dout based on the response of the system to the test current. The test current generator 50 has a number of capacitors $C_{DC1}$ to $C_{DC4}$ and switches $S_1$-$S_5$ which can be placed in different states to connect the capacitors either in series or in parallel across the battery 4. When the resistance monitor 26 is triggered, in steps 1-3 shown in the bottom left of FIG. 6, the coupling capacitors $C_{DC1}$ to $C_{DC4}$ are placed in series to discharge them. The capacitors are placed in series gradually in a number of steps with each step only connecting a subset of the capacitors in series. This is done to reduce the amount of overshoot of the battery voltage $V_{BAT}$ which occurs when each capacitor is connected in series to discharge the capacitor and cause charge to flow back to the battery 4. While FIG. 6 shows an example with four capacitors, it is possible to provide a greater number of capacitors so that a greater number of steps can be provided from the parallel state at the beginning of step 1 to the series state at the end of step 3.

Once all the capacitors are in series, a final step 4 is performed to simultaneously connect all the capacitors in parallel across the battery 4 (see step 4 at the bottom of FIG. 6). This creates a large current drawn from the battery as the battery voltage charges each of the capacitors $C_{DC1}$ to $C_{DC4}$. This results in an RC voltage curve on the battery voltage $V_{BAT}$ which rises with a characteristic time constant of $R_{BAT} \times \Sigma C$, where $\Sigma C$ is the sum of the individual capacitances of the capacitors $C_{DC1}$ to $C_{DC4}$. The RC response calculator 52 measures the RC time constant by comparing the battery voltage against an earlier sampled and divided version of the battery voltage $V_{SAMP}$. $V_{SAMP}$ is sampled in this example before step 1 of the capacitor configuration operation, by closing switch $S_5$, and is stabilised by opening the switch $S_5$ (for example between steps 3 and 4). However, in general the $V_{SAMP}$ could be sampled at any time before switching the capacitors from the series state to the parallel state at step 4. By using a divided version $V_{SAMP}$ of the battery voltage as the reference for measuring the time curve, the reference level will be set relative to the battery voltage so that the time taken to rise to the reference level is independent of the level of the battery voltage, providing a more reliable measure of the battery internal resistance.

A ripple counter 56 is triggered to start counting clock cycles when the capacitors are switched in parallel at step 4. A comparator 54 compares a voltage $V_{DC}$ at a node between capacitor $C_{DC4}$ and switch $S_{4B}$ with the sample voltage $V_{SAMP}$ and when $V_{DC}$ rises above $V_{SAMP}$ then this triggers a ripple counter 56 to stop counting clock cycles. Hence, the count value dout quantifies the time when $V_{DC} < V_{SAMP}$. Since $V_{SAMP}$ is relative to $V_{BAT}$ then the output dout is insensitive to $V_{BAT}$. The output dout of the ripple counter is then used by the threshold generator 23 to select the threshold voltage. While FIG. 6 shows the ripple counter 56 starting to count cycles at the point when the voltage drops at step 4, it is also possible to provide a further sampled reference level lower than $V_{SAMP}$, and to count the number of cycles taken for the voltage to rise from the lower reference level to $V_{SAMP}$. Regardless of which part of the RC curve is measured, the rise time will be dependent on RC.

In FIG. 6, the voltage compared against $V_{SAMP}$ is the voltage $V_{DC}$ at the node between capacitor $C_{DC4}$ and switch $S_{4B}$. Since switch $S_{4B}$ is closed in step 4, then $V_{DC}$ is the same as the battery voltage $V_{BAT}$ at this point. Hence, it would also be possible to compare $V_{BAT}$ against $V_{SAMP}$ using the comparator 54. However, as shown in the graph at the bottom right of FIG. 6, $V_{BAT}$ is high before step 4 while $V_{DC}$ is low. By comparing $V_{DC}$ against $V_{SAMP}$ instead of $V_{BAT}$, there is no need to ensure that the counter 56 starts counting after the voltage has dropped, simplifying the design of the counter 56. In general, any voltage level which is proportional to the battery voltage during step 4 may be compared against $V_{SAMP}$. The switch $S_5$ is closed when detecting $V_{SAMP}$ and is then opened to ensure that $V_{SAMP}$ is retained during subsequent steps.

An isolating switch $S_1$ is provided to isolate the circuitry 6 from the battery voltage $V_{BAT}$ when the resistance is being measured. By opening switch $S_1$, the system is protected from the test induced voltage drop. Since the system operates from a decoupling capacitance ($C_{DC0}$) during this time, the test event is kept short (for example less than 65 microseconds). Note that the test capacitors $C_{DC1}$ to $C_{DC4}$ act as standard decoupling capacitors during the normal operation of the circuitry 6.

Hence, in general the number of cycles counted by the ripple counter 56 is dependent on the internal resistance of the battery 4 because the rise time of the voltage is characterised by a time constant which depends on the capacitance of the capacitors and the resistance of battery 4.

Figure 7:
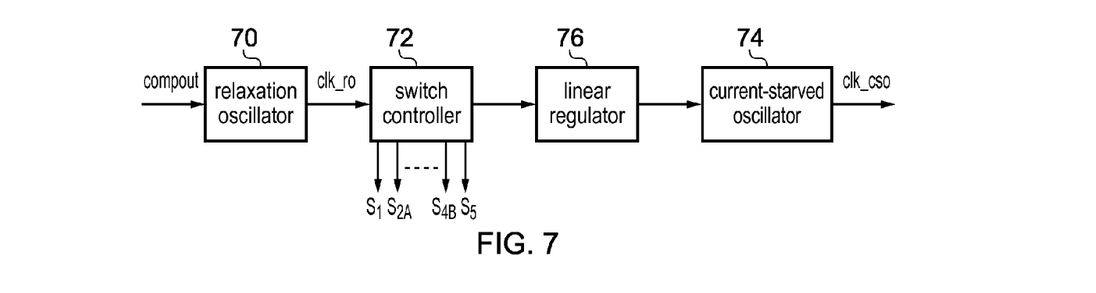
FIG. 7 shows an example of a clock generator for generating clock signals for controlling the resistance monitor.

FIG. 7 shows an example of a clock generator for generating clock signals for the ripple counter 56 and the control signals for controlling the switches of the resistance monitor 26. The clock generator has a relaxation oscillator 70 which generates a relatively slow clock signal clk_ro for controlling a switching controller 72 to generate the control signals for controlling the switches $S_1$ to $S_5$ in FIG. 6. A faster current starved oscillator 74 is also provided for generating the count clock signal clk_cso for controlling the ripple counter 56. The clock generator operates from a system supply voltage $V_{DD}$ rather than $V_{BAT}$, because $V_{BAT}$ tends to decrease too low during the RC curve generation. However, $V_{DD}$ decreases due to system current consumption since the switch $S_1$ is open during RC curve generation, and so a voltage regulator 76 is provided for the clock generator.

Figure 8:
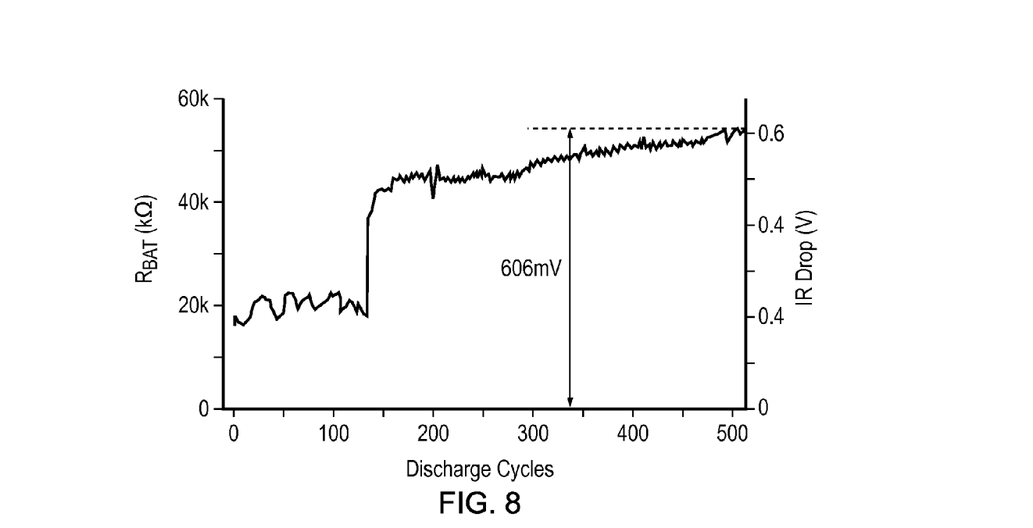
FIG. 8 shows an example of varying internal resistance of a battery with discharge cycles.
Figure 9:
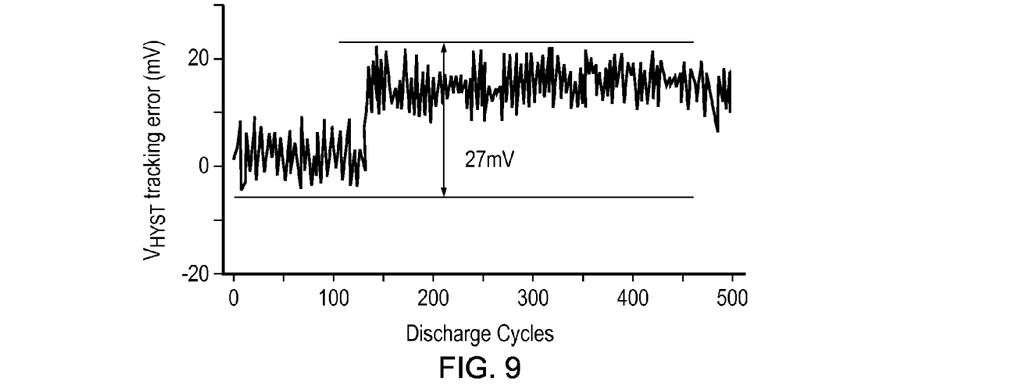
FIG. 9 shows tracking error of a hysteresis voltage.

The circuit shown in the above embodiments was fabricated in 180 nm CMOS. The battery supervisor circuit 8 was tested with a miniature 2 µAh thin-film battery (1.375×0.85 mm²) and a sensor system with $I_{SYSTEM.MAX}$=11 µA. The battery supervisor circuit 8 draws 1 nA during battery monitoring and 10 nJ/conv. for $R_{BAT}$ detection. FIGS. 8 and 9 show a 500 cycle test of the battery supervisory circuit with the 2 µAh battery. FIG. 8 shows the measured change in $R_{BAT}$ from 16 kΩ to 54 kΩ. FIG. 9 shows that the battery supervisor circuit 8 has a maximum $V_{HYST}$ tracking error of 27 mV. The tracking error represents the difference between the ideal hysteresis $V_{HYST}=V_{ENABLE.EFF}-V_{DISABLE}$ and the actual effective hysteresis achieved corresponding to ($V_{ENABLE}-R_{BAT}\times I_{SYSTEM})$ $V_{DISABLE}$, which arises because the threshold voltage generator 23 in FIG. 5 has a number of discrete threshold levels which it can select, rather than providing a continuously varying threshold. Assuming a 50 mV margin, the proposed system requires an effective $V_{HYST}$=50+27=77 mV. In comparison, a conventional system requires 656 mV hysteresis to accommodate the worst case $R_{BAT}$=54 kΩ condition after 500 cycles. The proposed battery supervisory circuit 8 therefore provides 2.7 times the usable battery voltage range ($V_{BAT}$ min/max=3.2V/4.2V).

Figure 10:
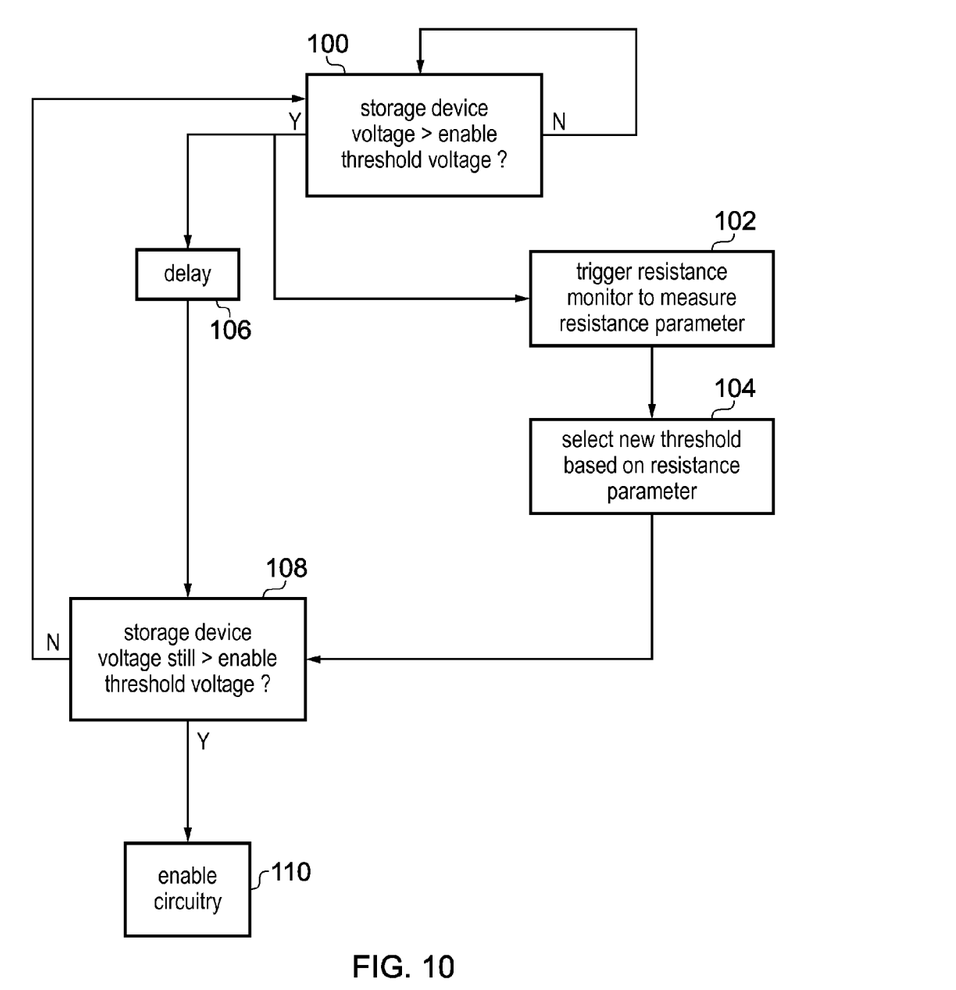
FIG. 10 shows a method of operating an electronic device.

FIG. 10 shows a method of controlling enabling of the circuitry 6 depending on the storage device voltage generated by the storage device 4. At step 100 the supervisor circuit 8 determines whether the storage device voltage exceeds the enable threshold voltage. If not then the supervisor circuit 8 continues monitoring the storage device voltage. When the storage device voltage exceeds the threshold, then at step 102 the supervisor circuit 8 triggers the resistance monitor 26 to measure the resistance parameter which indicates the internal resistance of the storage device 4. At step 104 a new threshold value is selected based on the resistance parameter. Meanwhile, after a delay provided at step 106 by the power-on delay generator 24, at step 108 it is determined whether the storage device voltage still exceeds the enable threshold voltage. If not then the method returns to step 100. For example, if the storage device voltage drops, or the adjustment to the threshold at step 104 means the threshold is now higher than the voltage, then the supervisor circuit 8 inhibits enabling of the circuitry 6. On the other hand, if the storage device voltage is higher than the enable threshold voltage then at step 110 the circuitry is enabled.

The resistance monitor circuit 26 shown in FIG. 6 may also be used for purposes other than adjusting the enable threshold voltage for enabling circuitry. For example, the resistance parameter dout provided by the resistance monitor circuit 26 may be used as a general indication of the health of the battery 4 or other energy storage device. For example, if the resistance gets too high then this could indicate that the battery should be replaced, for example. Hence, the supervisor circuit 8 may output a warning signal if the resistance parameter indicates that the resistance is higher than a given threshold. The warning signal may then be used to trigger a visual or audible indication that the battery is, or will soon become, unusable. Hence, in general an electronic device may have a resistance monitoring circuit for monitoring an internal resistance of an energy storage device, the resistance monitoring circuit comprising any one or more of the following features in combination:

the resistance monitoring circuit may comprise a test current generator configured to draw a test current from the energy storage device for testing the internal resistance of the energy storage device.

the resistance monitoring circuit may comprise an isolation switch configured to isolate the circuitry from the storage device voltage when the test current is drawn from the energy storage device.

the test current generator may comprise at least one capacitive element coupled across the energy storage device, and the resistance parameter may be indicative of a rate with which the storage device voltage rises following a voltage drop caused by the test current being drawn from the energy storage device.

the resistance parameter may comprise a count value representing a time taken for the storage device voltage to rise to a sample voltage level following the voltage drop caused by the test current.

the sample voltage level may correspond to a fraction of a level of the storage device voltage captured prior to drawing the test current from the energy storage device the resistance monitoring circuit may have a counter configured to increment the count value in response to a count clock signal until the storage device voltage exceeds the sample voltage level;

a clock generator for generating the count clock signal may be powered by a regulated voltage.

the test current generator may comprise a plurality of capacitors and a plurality of switches for selecting whether the capacitors are coupled in parallel or coupled in series across the energy storage device the test current generator may be configured to generate the test current by switching the plurality of switches from a first state in which the plurality of capacitors are coupled in series across the energy storage device to a second state in which the plurality of capacitors are coupled in parallel across the energy storage device.

before generating the test current, the test current generator may switch the plurality of switches from the second state to the first state.

the test current generator may switch the plurality of switches from the second state to the first state in a plurality of steps, each step for coupling a subset of the capacitors in series.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An electronic device comprising:
an energy storage device;
circuitry supplied with a storage device voltage from the energy storage device; and
a supervisor circuit configured to enable the circuitry in response to the storage device voltage exceeding an enable threshold voltage;
wherein the supervisor circuit is configured to detect a resistance parameter indicative of an internal resistance of the energy storage device and to adjust the enable threshold voltage based on the resistance parameter;
wherein the supervisor circuit comprises a test current generator configured to draw a test current from the energy storage device for testing the internal resistance of the energy storage device; and
wherein the test current generator comprises a plurality of capacitors and a plurality of switches for selecting whether the capacitors are coupled in parallel or coupled in series across the energy storage device.

2. The electronic device according to claim 1, wherein the energy storage device comprises a battery.

3. The electronic device according to claim 1, comprising an energy harvesting unit configured to harvest ambient energy, wherein the energy storage device is charged based on the energy harvested by the energy harvesting unit.

4. The electronic device according to claim 1, wherein the supervisor circuit is configured to disable the circuitry in response to the storage device voltage dropping below a disable threshold voltage, wherein the disable threshold voltage is less than the enable threshold voltage.

5. The electronic device according to claim 1, wherein the supervisor circuit is configured to adjust the enable threshold voltage to have a value corresponding to a sum of a target threshold voltage and a margin voltage, wherein the margin voltage depends on the resistance parameter.

6. The electronic device according to claim 1, wherein the supervisor circuit comprises a threshold voltage generator configured to generate a plurality of different threshold voltage levels and to set the enable threshold voltage to one of the plurality of threshold voltage levels selected based on the resistance parameter.

7. The electronic device according to claim 1, wherein the supervisor circuit is configured to trigger detection of the resistance parameter and adjustment of the enable threshold voltage in response to the storage device voltage exceeding a current value of the enable threshold voltage.

8. The electronic device according to claim 1, wherein the supervisor circuit is configured to enable the circuitry after a delay period has elapsed following the storage device voltage exceeding the enable voltage threshold; and
if the storage device voltage no longer exceeds the enable voltage threshold before the end of the delay period, then the supervisor circuit is configured to inhibit enabling of the circuitry.

9. The electronic device according to claim 1, comprising an isolation switch configured to isolate the circuitry from the storage device voltage when the test current is drawn from the energy storage device.

10. The electronic device according to claim 1, wherein the resistance parameter is indicative of an amount by which the storage device voltage drops when the test current is drawn from the energy storage device.

11. The electronic device according to claim 1, wherein the test current generator comprises at least one capacitive element coupled across the energy storage device, and the resistance parameter is indicative of a rate with which the storage device voltage rises following a voltage drop caused by the test current being drawn from the energy storage device.

12. The electronic device according to claim 1,
wherein the test current generator is configured to generate the test current by switching the plurality of switches from a first state in which the plurality of capacitors are coupled in series across the energy storage device to a second state in which the plurality of capacitors are coupled in parallel across the energy storage device.

13. The electronic device according to claim 12, wherein before generating the test current, the test current generator is configured to switch the plurality of switches from the second state to the first state.

14. The electronic device according to claim 13, wherein the test current generator is configured to switch the plurality of switches from the second state to the first state in a plurality of steps, each step for coupling a subset of the capacitors in series.

15. The electronic device according to claim 1, wherein the supervisor circuit is configured to output a warning signal if the resistance parameter indicates that the internal resistance of the energy storage device is higher than a threshold resistance.

16. An electronic device comprising:
an energy storage device;
circuitry supplied with a storage device voltage from the energy storage device; and
a supervisor circuit configured to enable the circuitry in response to the storage device voltage exceeding an enable threshold voltage;
wherein the supervisor circuit is configured to detect a resistance parameter indicative of an internal resistance of the energy storage device and to adjust the enable threshold voltage based on the resistance parameter;

wherein the supervisor circuit comprises a test current generator configured to draw a test current from the energy storage device for testing the internal resistance of the energy storage device; and wherein the resistance parameter comprises a count value representing a time taken for the storage device voltage to rise to a sample voltage level following the voltage drop caused by the test current.

17. The electronic device according to claim 16, wherein the sample voltage level corresponds to a fraction of a level of the storage device voltage captured prior to drawing the test current from the energy storage device.

18. The electronic device according to claim 16, comprising a counter configured to increment the count value in response to a count clock signal until the storage device voltage exceeds the sample voltage level;

wherein a clock generator for generating the count clock signal is powered by a regulated voltage.

19. An electronic device comprising:

energy storage means for storing energy;

circuit means for being supplied with a storage device voltage from the energy storage means; and supervising means for enabling the circuit means in response to the storage device voltage exceeding an enable threshold voltage;

wherein the supervising means is configured to detect a resistance parameter indicative of an internal resistance of the energy storage means and to adjust the enable threshold voltage based on the resistance parameter;

wherein the supervising means comprises a test current generating means configured to draw a test current from the energy storage means for testing the internal resistance of the energy storage means; and wherein the test current generating means comprises a plurality of capacitors and a plurality of switches for selecting whether the capacitors are coupled in parallel or coupled in series across the energy storage means.

20. A method for an electronic device comprising an energy storage device and circuitry supplied with a storage device voltage from the energy storage device; the method comprising:

detecting whether the storage device voltage exceeds an enable threshold voltage;

enabling the circuitry in response to the storage device voltage exceeding the enable threshold voltage;

detecting a resistance parameter indicative of an internal resistance of the energy storage device;

drawing a test current from the energy storage device for testing the internal resistance of the energy storage device;

coupling a plurality of capacitors and a plurality of switches to the energy storage device in a configuration for selecting whether the capacitors are coupled in parallel or coupled in series across the energy storage device; and adjusting the enable threshold voltage based on the resistance parameter.

\* \* \* \* \*